US011353321B2

(12) United States Patent
Volkovich et al.

(10) Patent No.: US 11,353,321 B2
(45) Date of Patent: Jun. 7, 2022

(54) METROLOGY SYSTEM AND METHOD FOR MEASURING DIAGONAL DIFFRACTION-BASED OVERLAY TARGETS

(71) Applicant: KLA Corporation, Milpitas, CA (US)

(72) Inventors: Roie Volkovich, Hadera (IL); Ohad Bachar, Timrat (IL); Nadav Gutman, Zichron Ya'aqov (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/900,626

(22) Filed: Jun. 12, 2020

(65) Prior Publication Data

US 2021/0389125 A1 Dec. 16, 2021

(51) Int. Cl.
*G01B 11/27* (2006.01)
*G01B 9/02001* (2022.01)
*G03F 7/20* (2006.01)
*G01M 11/02* (2006.01)

(52) U.S. Cl.
CPC ........ *G01B 11/272* (2013.01); *G01B 9/02001* (2013.01); *G03F 7/70* (2013.01); *G03F 7/70125* (2013.01); *G03F 7/70483* (2013.01); *G03F 7/70691* (2013.01); *G03F 7/70775* (2013.01);
(Continued)

(58) Field of Classification Search
CPC .............. G01B 11/272; G01B 9/02001; G01B 2210/56; G03F 7/70775; G03F 7/70125; G03F 7/70; G03F 7/70691; G03F 7/70483; G01M 11/0207
See application file for complete search history.

(56) References Cited

U.S. PATENT DOCUMENTS

| 16,477,522 | | 7/2019 | Volkovich et al. |
| 10,473,460 | B2 | 11/2019 | Gutman et al. |
| 10,533,848 | B2 | 1/2020 | Shchegrov et al. |

(Continued)

FOREIGN PATENT DOCUMENTS

| KR | 1020170138620 A | 12/2017 |
| WO | 2011026055 A3 | 7/2011 |
| WO | 2020035272 A1 | 2/2020 |

OTHER PUBLICATIONS

PCT International Search Report and Written Opinion for International Application No. PCT/US2021/035813 dated Sep. 24, 2021, 7 pages.

*Primary Examiner* — Jonathan M Hansen
(74) *Attorney, Agent, or Firm* — Suiter Swantz pc llo

(57) ABSTRACT

A metrology system is disclosed, in accordance with one or more embodiments of the present disclosure. The metrology system includes a stage configured to secure a sample, one or more diffraction-based overlay (DBO) metrology targets disposed on the sample. The metrology system includes a light source and one or more sensors. The metrology system includes a set of optics configured to direct illumination light from the light source to the one or more DBO metrology targets of the sample, the set of optics including a half-wave plate, the half-wave plate selectively insertable into an optical path such that the half-wave plate selectively passes both illumination light from an illumination channel and collection light from a collection channel, the half-wave plate being configured to selectively align an orientation of linearly polarized illumination light from the light source to an orientation of a grating of the one or more DBO metrology targets.

23 Claims, 9 Drawing Sheets

(52) U.S. Cl.
CPC ..... *G01B 2210/56* (2013.01); *G01M 11/0207* (2013.01)

(56) References Cited

U.S. PATENT DOCUMENTS

| | | | |
|---|---|---|---|
| 2004/0169923 A1 | 9/2004 | Hug | |
| 2015/0301455 A1 | 10/2015 | Schlesener et al. | |
| 2018/0364472 A1* | 12/2018 | Ogawa | G02B 21/02 |
| 2018/0364590 A1 | 12/2018 | Schaar et al. | |
| 2020/0103772 A1* | 4/2020 | Goorden | G03F 9/7065 |

* cited by examiner

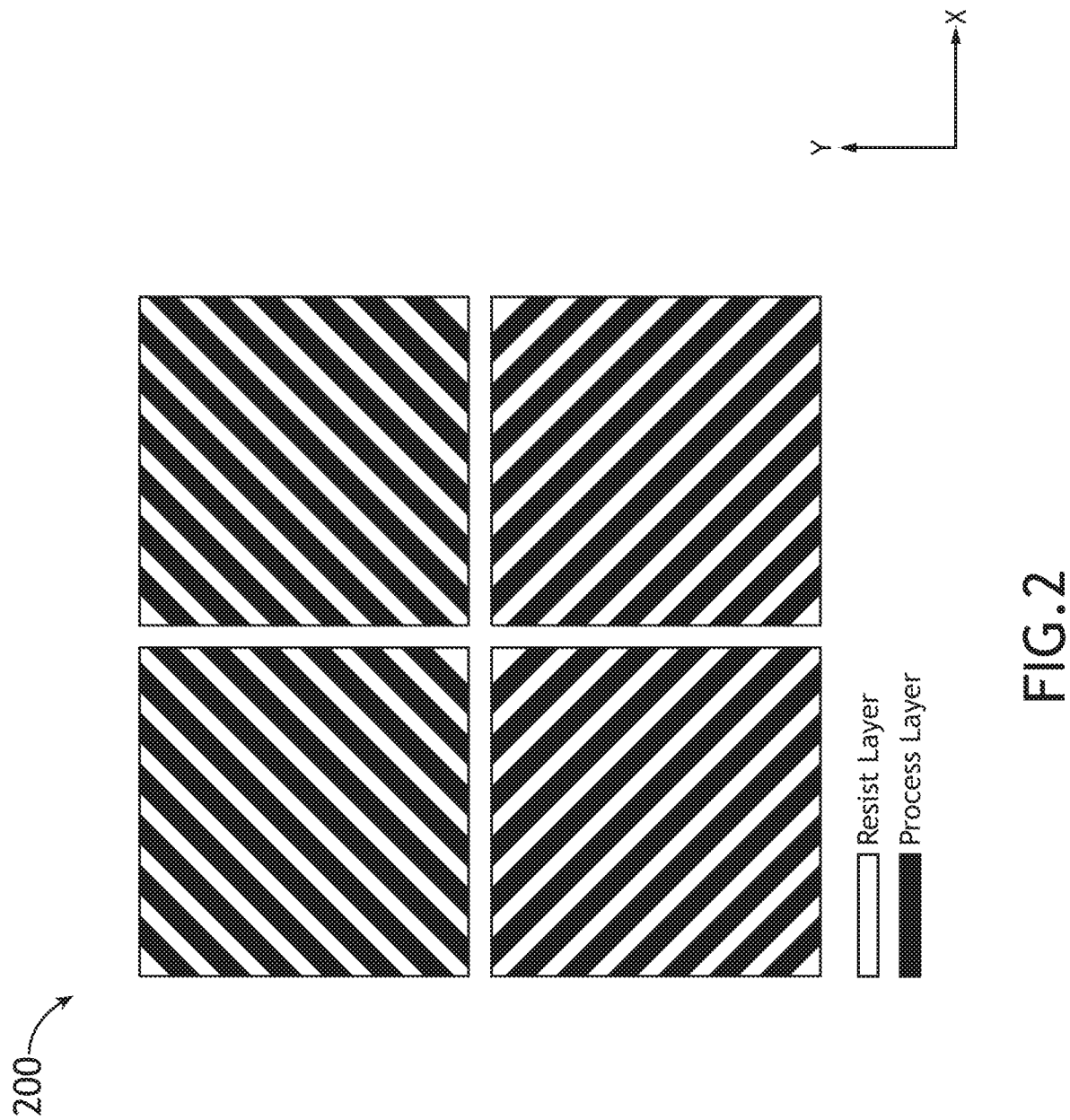

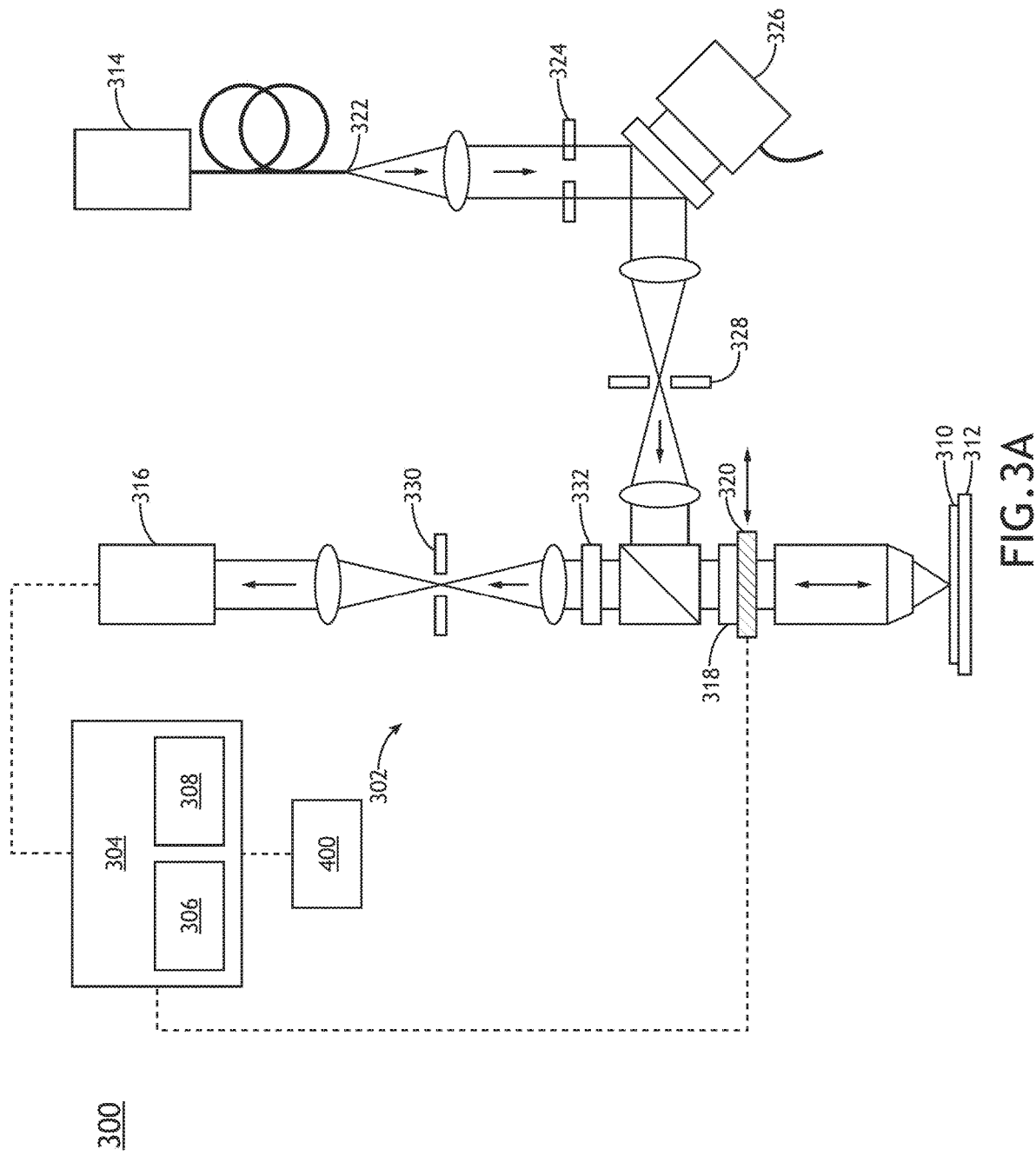

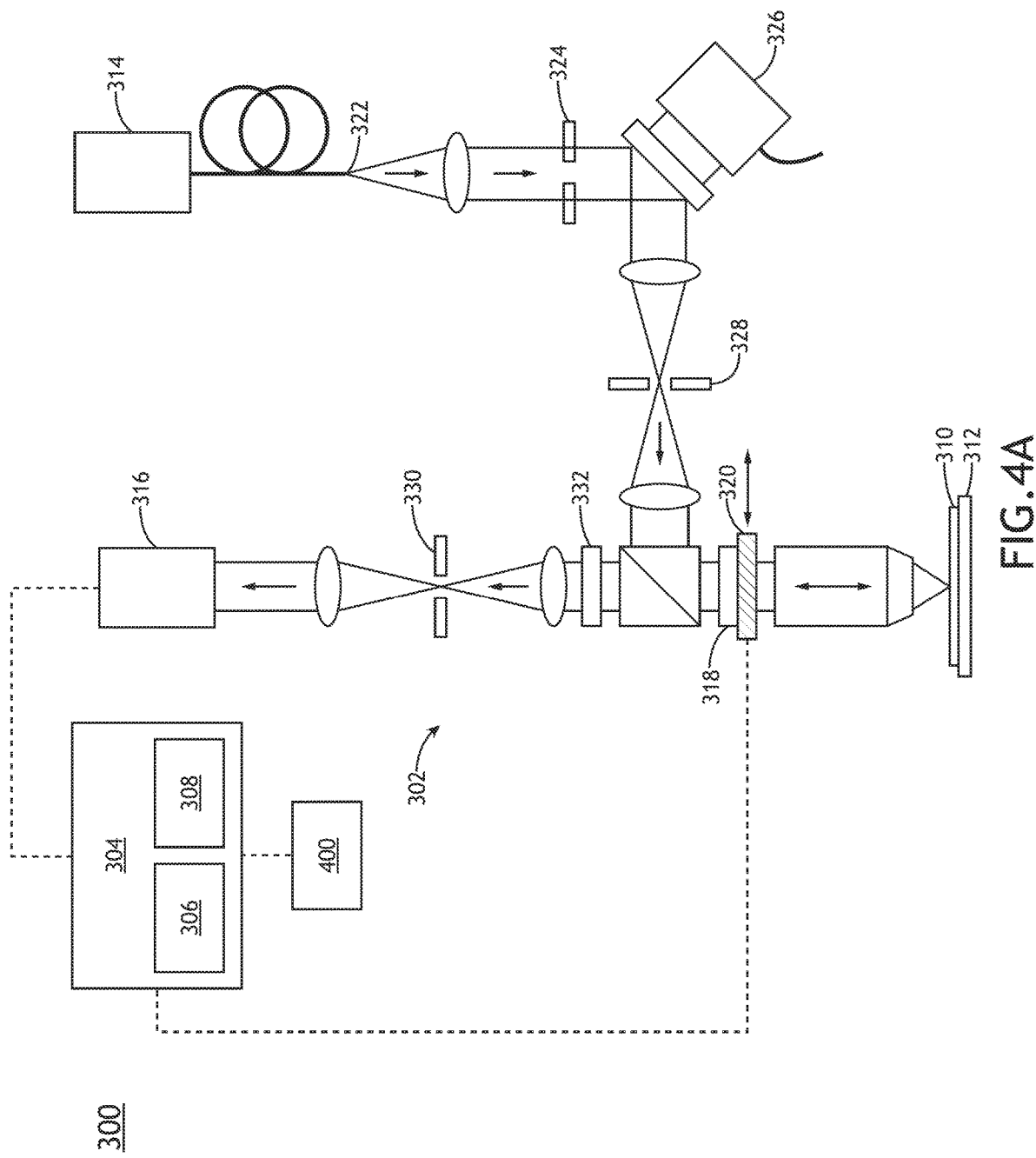

METROLOGY SYSTEM AND METHOD FOR MEASURING DIAGONAL DIFFRACTION-BASED OVERLAY TARGETS

TECHNICAL FIELD

The present invention generally relates to metrology systems, and, more particularly, to a metrology system for measuring diagonal diffraction-based overlay (DBO) targets.

BACKGROUND

Overlay metrology systems typically measure the alignment of multiple layers of a sample by characterizing an overlay metrology target having target features located on sample layers of interest. The overlay metrology targets are often measured during overlay metrology. Current systems require the sample or sample chuck to be rotated to measure the overlay metrology target. This system can increase throughput measurement time and requires additional calibration to ensure that the sample is in the correct position.

Therefore, it would be desirable to provide a system and method that cure the shortfalls of the previous approaches identified above.

SUMMARY

A metrology system is disclosed, in accordance with one or more embodiments of the present disclosure. In one embodiment, the metrology system includes a stage configured to secure a sample, one or more diffraction-based overlay metrology targets being disposed on the sample. In another embodiment, the metrology system includes a light source. In another embodiment, the metrology system includes one or more sensors. In another embodiment, the metrology system includes a set of optics configured to direct illumination light from the light source to the one or more diffraction-based overlay metrology targets of the sample, the set of optics including an insertable, rotatable half-wave plate, the insertable, rotatable half-wave plate selectively insertable into an optical path such that the insertable, rotatable half-wave plate selectively passes both illumination light from an illumination channel of the set of optics and collection light from a collection channel of the set of optics, the insertable, rotatable half-wave plate being configured to selectively align an orientation of linearly polarized illumination light from the light source to an orientation of a grating of the one or more diffraction-based overlay metrology targets.

A method is disclosed in accordance with one or more embodiments of the present disclosure. In one embodiment, the method includes generating light with a light source. In another embodiment, the method includes directing the light along an optical path to one or more diffraction-based overlay metrology targets disposed on a sample via a set of optics. In another embodiment, the method includes selectively inserting a half-wave plate into the optical path such that the half-wave plate selectively passes illumination light from an illumination channel of the set of optics and collection light from a collection channel of the set of optics. In another embodiment, the method includes aligning an orientation of linearly polarized illumination light from the light source to an orientation of a grating of the one or more diffraction-based overlay metrology targets. In another embodiment, the method includes transmitting collected light through the half-wave plate and a collection polarizer. In another embodiment, the method includes collecting light from the collection polarizer with one or more sensors. In another embodiment, the method includes determining overlay misregistration between a first layer and a second layer of the one or more diffraction-based overlay metrology targets based on the collected light.

A method is disclosed in accordance with one or more embodiments of the present disclosure. In one embodiment, the method includes generating light with a light source. In another embodiment, the method includes directing the light along an optical path to one or more diffraction-based overlay metrology targets disposed on a sample via a set of optics. In another embodiment, the method includes selectively inserting a half-wave plate into the optical path such that the half-wave plate selectively passes illumination light from an illumination channel of the set of optics and collection light from a collection channel of the set of optics. In another embodiment, the method includes aligning an orientation of linearly polarized illumination light from the light source to an orientation of a grating of the one or more diffraction-based overlay metrology targets. In another embodiment, the method includes transmitting collected light through the half-wave plate and a collection polarizer. In another embodiment, the method includes collecting light from the collection polarizer with one or more sensors. In another embodiment, the method includes determining overlay misregistration between a first layer and a second layer of the one or more diffraction-based overlay metrology targets based on the collected light. In another embodiment, the method includes receiving calibration data from one or more additional characterization tools. In another embodiment, the method includes correcting the determined overlay misregistration between the first layer and the second layer of the one or more diffraction-based overlay metrology targets based on the calibration data from the one or more additional characterization tools.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 2 illustrates diagonal DBO targets, in accordance with one or more embodiments of the present disclosure.

FIG. 3A illustrates a simplified schematic view of a metrology system, in accordance with one or more embodiments of the present disclosure.

FIG. 4A illustrates a simplified schematic view of the metrology system including an additional characterization system, in accordance with one or more embodiments of the present disclosure.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Figure 1:
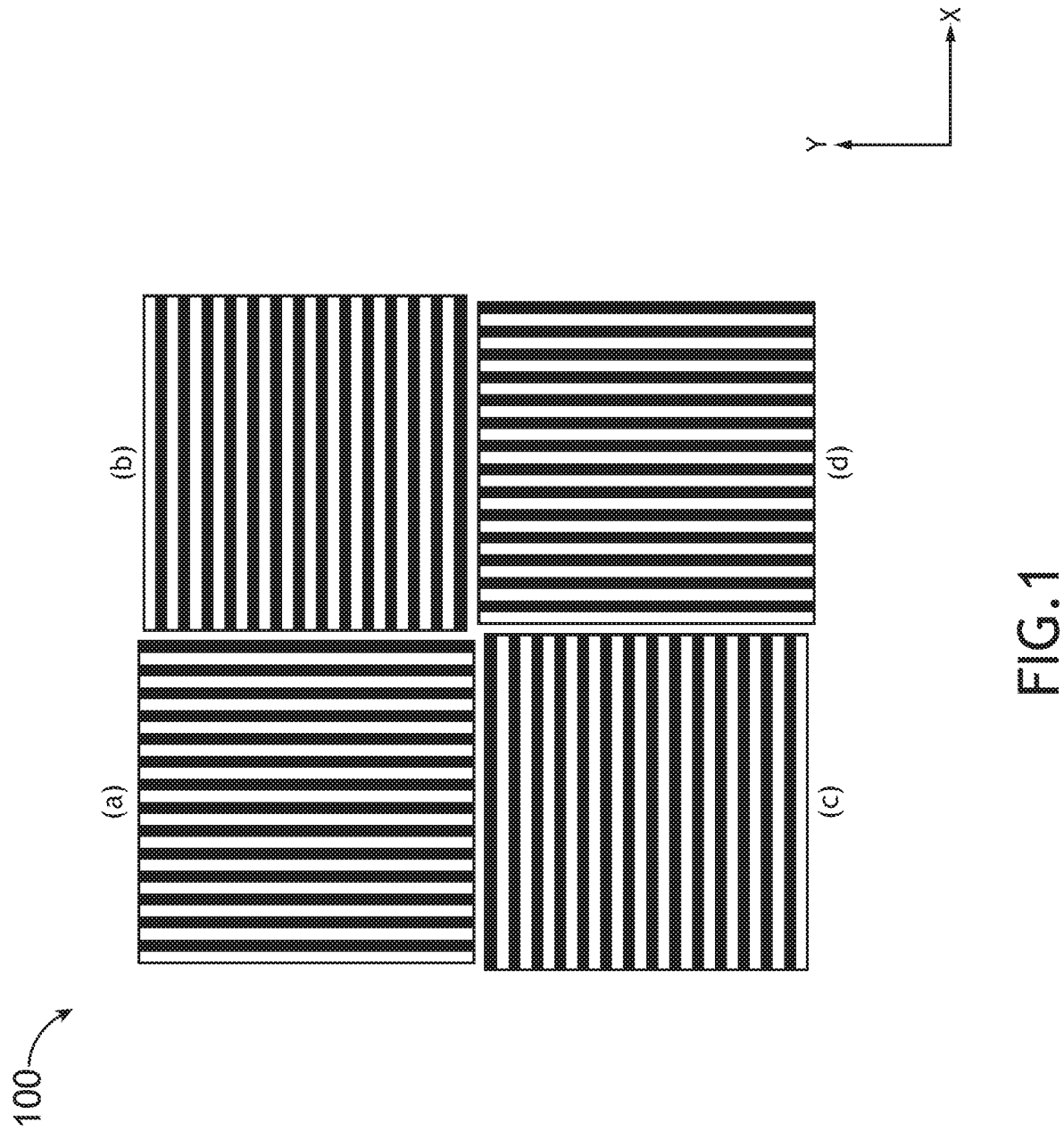
FIG. 1 illustrates diffraction-based overlay (DBO) targets, in accordance with one or more embodiments of the present disclosure.

Overlay metrology tools may utilize a variety of techniques to determine the overlay of sample layers. Scatterometry-based metrology (or diffraction-based overlay (DBO) metrology) may illuminate an overlay target (e.g., a DBO target) and capture an overlay signal including an angular distribution of radiation emanating from the overlay target (e.g., the DBO target) associated with diffraction, scattering, and/or reflection of the illumination beam. DBO metrology tools utilize a dedicated metrology target to reflect the mis-registration (e.g., overlay between aligned layers). For example, as shown in FIG. 1, the DBO metrology tools may utilize a DBO target 100 for measuring the overlay in X and Y directions.

Due to recent developments in lithographic patterning and more advanced illumination schemes in lithography scanners, there is a need to print targets using diagonal pattern lines, as shown in FIG. 2. It is contemplated herein that the diagonal DBO targets 200 aim to more accurately represent the device and improve the overlay accuracy and correlation to the device.

However, in order to measure the diagonal pattern on the diagonal DBO targets (e.g., the diagonal DBO targets 200 shown in FIG. 2) with the correct orientation either the sample or the sample chuck must be rotated. Such rotation can impact throughput and may require additional calibration to make sure the sample is placed in the correct orientation such that the diagonal pattern of the DBO target is reflected.

Embodiments of the present disclosure are directed to a system and method for measuring diagonal diffraction-based overlay (DBO) metrology targets. Specifically, embodiments of the present disclosure are directed to an optical configuration of a metrology system configured to measure a diagonal pattern of the diagonal DBO metrology target. In particular, the metrology system includes an insertable, rotatable half-wave plate configured to be selectively inserted in an optical path of the metrology system.

FIG. 3A illustrates a simplified schematic view of a metrology system 300, in accordance with one or more embodiments of the present disclosure.

In one embodiment, the metrology system 300 includes a metrology sub-system 302. For the purposes of the present disclosure, it is noted herein that the metrology sub-system 302 may be referred to as a metrology tool.

The metrology sub-system 302 may be any type of overlay metrology tool known in the art. For example, the metrology sub-system 302 may be a scatterometry-based overlay metrology tool in which radiation from a sample is analyzed at a pupil plane to characterize the angular distribution of radiation from the sample (e.g., associated with scattering and/or diffraction of radiation by the sample). The metrology system 300 may be configured to acquire one or more overlay metrology measurements from one or more metrology targets disposed on the sample 310. In one embodiment, the one or more overlay metrology targets include one or more diffraction-based overlay (DBO) metrology targets. For example, the sample 310 may include one or more diagonal DBO metrology targets, such as the diagonal DBO metrology target 200 depicted in FIG. 2. The metrology target may include, but is not limited to, a first layer with a diagonal pattern and a second layer with a straight-line pattern (e.g., x- or y-direction). For instance, the resist layer may have a diagonal pattern and the process layer may have a straight-line pattern, or vice versa. In another instance, the metrology target may include a first layer with a diagonal pattern and a second layer with a diagonal pattern. In this regard, the resist and process layer may both have diagonal patterns.

In another embodiment, the metrology system 300 includes a controller 304 communicatively coupled to the metrology sub-system 302. In another embodiment, the controller 304 includes one or more processors 306. For example, the one or more processors 306 may be configured to execute a set of program instructions maintained in a memory device 308, or memory. The one or more processors 306 of a controller 304 may include any processing element known in the art. In this sense, the one or more processors 306 may include any microprocessor-type device configured to execute algorithms and/or instructions. Further, the memory device 308 may include any storage medium known in the art suitable for storing program instructions executable by the associated one or more processors 306. For example, the memory device 308 may include a non-transitory memory medium. As an additional example, the memory device 308 may include, but is not limited to, a read-only memory, a random-access memory, a magnetic or optical memory device (e.g., disk), a magnetic tape, a solid-state drive and the like. It is further noted that memory device 308 may be housed in a common controller housing with the one or more processors 306.

In one embodiment, the metrology sub-system 302 includes a sample stage 312 configured to secure a sample 310. For example, the sample 310 may be disposed upon the sample stage 312 to facilitate movement of sample 310. In some embodiments, the sample stage 312 is an actuatable stage. For example, the sample stage 312 may include, but is not limited to, one or more translational stages suitable for selectively translating the sample 310 along one or more linear directions (e.g., x-direction, y-direction and/or z-direction). By way of another example, the sample stage 312 may include, but is not limited to, one or more rotational stages suitable for selectively rotating the sample 310 along a rotational direction. By way of another example, the sample stage 312 may include, but is not limited to, a rotational stage and a translational stage suitable for selectively translating the sample 310 along a linear direction and/or rotating the sample 310 along a rotational direction. It is noted herein that the system may operate in any scanning mode known in the art.

In another embodiment, the metrology sub-system 302 includes a light source 314 configured to produce illumination light. For example, the metrology sub-system 302 may include any light source 314 known in the art. For instance, the metrology sub-system 302 may include, but is not limited to, a supercontinuum laser source 314.

In one embodiment, the metrology sub-system 302 includes one or more sensors 316. For example, the metrology sub-system 302 may include one or more sensors 316 communicatively coupled to the controller 304. The metrology sub-system 302 may include any sensor known in the art. For example, the metrology sub-system 302 may include an array sensor 316 positioned at a pupil plane.

In another embodiment, the metrology sub-system 302 includes a set of optics configured to direct illumination light from the light source 314 to the one or more DBO metrology targets of the sample 310.

In one embodiment, the set of optics includes an insertable, rotatable half-wave plate 318. For example, the insertable, rotatable half-wave plate 318 may be configured to be selectively inserted into an optical path such that the insertable, rotatable half-wave plate selectively passes both illumination light from an illumination channel of the set of optics and collection light from a collection channel of the set of optics. For instance, the metrology sub-system 302 may include an actuation stage 320 configured to secure the insertable, rotatable half-wave plate 318 and selectively insert the insertable, rotatable half-wave plate 318 into the optical path and rotate the insertable, rotatable half-wave plate 318.

By way of another example, the insertable, rotatable half-wave plate 318 may configured to selectively align an orientation of linearly polarized illumination light from the light source 314 to an orientation of a grating on the one or more DBO metrology targets. For instance, the insertable, rotatable half-wave plate 318 may be configured to selectively rotate the rotatable half-wave plate 318 to align an orientation of linearly polarized illumination light from the light source 314 to an orientation of the grating of one or more diagonal DBO metrology targets. In this regard, the insertable, rotatable half-wave plate 318 is configured to align the orientation of the incident linearly polarized illumination from the light source 314 to the orientation of the grating of the one or more diagonal DBO targets to enhance a sensitivity of the one or more sensors 316 to overlay.

The actuation stage 320 may include, but is not limited to, one or more translational stages suitable for selectively translating the half-wave plate 318 along one or more linear directions (e.g., x-direction, y-direction, and/or z-direction). By way of another example, the actuation stage 320 may include, but is not limited to, one or more rotational stages suitable for selectively rotating the half-wave plate 318. By way of another example, the actuation stage 320 may include, but is not limited to, a combined rotational and translational stage suitable for selectively translating the half-wave plate 318 along a linear direction and/or rotating the half-wave plate 318.

In one embodiment, the actuation stage 320 may be configured to selectively insert the insertable, rotatable half-wave plate 318 into the optical path and/or rotate the half-wave plate 318 in response to one or more control signals from a controller 304. In another embodiment, the actuation stage 320 may be configured to selectively insert the insertable, rotatable half-wave plate 318 into the optical path in response to one or more control signals from a user-enabled controller. In another embodiment, the actuation stage 320 may be configured to automatically insert the insertable, rotatable half-wave plate 318 into the optical path. For example, the half-wave plate 318 may be automatically inserted into the optical path in response to one or more signals from the one or more sensors 316. In another embodiment, the actuation stage 320 is configured to automatically rotate the insertable, rotatable half-wave plate 318. For example, the half-wave plate 318 may be automatically rotated based on feedback from the one or more sensors 316 until the signal (or contrast) is maximized.

It is noted herein that the insertable, rotatable half-wave plate is used for aligning the orientation of the linearly polarized light to the orientation of the diagonal target grating, such that signal sensitivity to overlay may be maximized to achieve optimal measurement precision and accuracy. Further, it is noted herein that locating the half-wave plate such that light is double-passing through the half-wave plate in both illumination and collection channels allows the collection polarizer (the system polarization analyzer) to be maintained at a fixed orientation without experiencing unwanted light loss.

In another embodiment, the set of optics includes a polarized single-mode (SM) optical fiber 322. For example, the polarized SM optical fiber 322 may be configured to deliver the illumination 313 from the light source 314 via the polarized SM optical fiber 322.

In another embodiment, the set of optics includes an apodized illumination pupil 324. For example, the apodized illumination pupil 324 may include an adjustable obliquity. For instance, the obliquity of the apodized illumination pupil may be adjustable.

In another embodiment, the set of optics includes a spot scanner 326. For example, the spot scanner 326 may be configured to provide decoherence to the illumination from the light source 314.

In another embodiment, the set of optics includes one or more field stops. For example, the set of optics may include one or more illumination field stops 328. For instance, the set of optics may include one or more stray light illumination field stops 328. By way of another example, the set of optics may include one or more collection field stops 330. For instance, the set of optics may include one or more stray light collection field stops 330.

In another embodiment, the set of optics includes a collection polarizer 332. For example, the collection polarizer 332 may be maintained at a fixed orientation within the metrology sub-system 302. In this regard, the sample 310 may be maintained at a fixed orientation such that the actuation sample stage 312 maintains the sample 310 at the fixed orientation.

It is noted herein that the one or more components of the disclosed system may be communicatively coupled to the various other components of the system in any manner known in the art. For example, the one or more components of the system 300 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

Figure 3B:
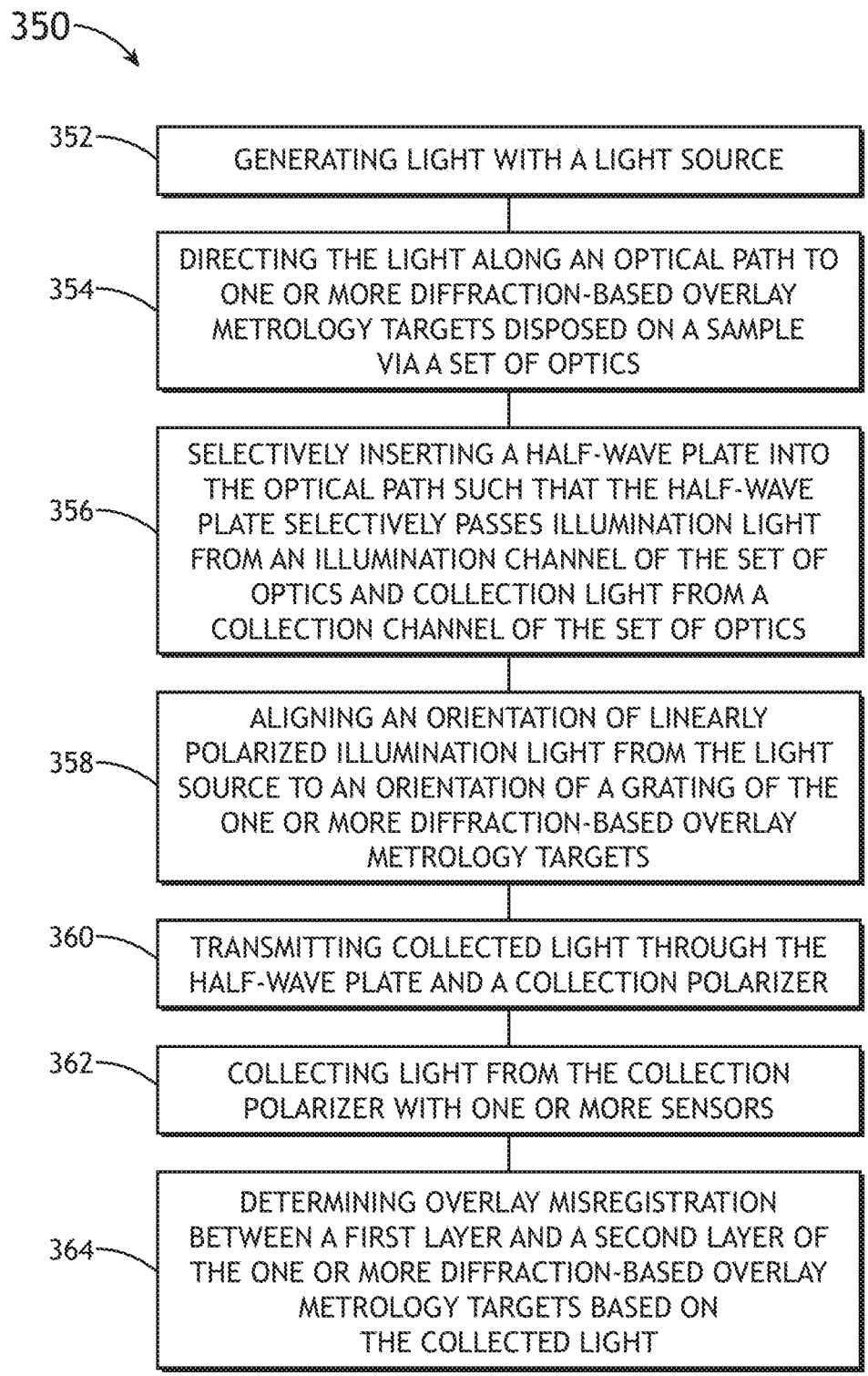
FIG. 3B illustrates a flow diagram of a method for measuring DBO targets, in accordance with one or more embodiments of the present disclosure.

FIG. 3B illustrates a flowchart of a method 350 for measuring diagonal DBO metrology targets, in accordance with one or more embodiments of the present disclosure. It is noted herein that the steps of method 350 may be implemented all or in part by system 300. It is further recognized, however, that the method 350 is not limited to the system 300 in that additional or alternative system-level embodiments may carry out all or part of the steps of method 350.

In step 352, light is generated with a light source. For example, the light source 314 of the metrology sub-system

302 may be configured to generate light. In some embodiments, the light source 314 includes a supercontinuum laser source.

In step 354, the light generated with the light source is directed to one or more DBO metrology targets disposed on a sample via set of optics. In one embodiment, the sample 310 includes one or more DBO metrology targets disposed on the sample 310. For example, the sample 310 may include one or more diagonal DBO metrology targets, such as the diagonal DBO metrology target 200 depicted in FIG. 2. The metrology target may include, but is not limited to, a first layer with a diagonal pattern and a second layer with a straight-line pattern (e.g., x- or y-direction). For instance, the resist layer may have a diagonal pattern and the process layer may have a straight-line pattern, or vice versa. In another instance, the metrology target may include a first layer with a diagonal pattern and a second layer with a diagonal pattern. In this regard, the resist and process layer may both have diagonal patterns.

In step 356, a half-wave plate is selectively inserted into the optical path. For example, the half-wave plate may be selectively inserted such that the half-wave plate selectively passes illumination from an illumination channel of the set of optics and collection light from a collection channel of the set of optics. In one embodiment, the actuation stage 320 of the metrology sub-system 302 is configured to secure the half-wave plate 318 and selectively insert the half-wave plate 318 into the optical path. In this regard, the actuation stage 320 may rotate the half-wave plate 318 once inserted into the optical path.

In one embodiment, the actuation stage 320 may be configured to selectively insert the insertable, rotatable half-wave plate 318 into the optical path and/or rotate the half-wave plate 318 in response to one or more control signals from a controller 304. In another embodiment, the actuation stage 320 may be configured to selectively insert the insertable, rotatable half-wave plate 318 into the optical path in response to one or more control signals from a user-enabled controller. In another embodiment, the actuation stage 320 may be configured to automatically insert the insertable, rotatable half-wave plate 318 into the optical path. For example, the half-wave plate 318 may be automatically inserted into the optical path in response to one or more signals from the one or more sensors 316. In another embodiment, the actuation stage 320 is configured to automatically rotate the insertable, rotatable half-wave plate 318. For example, the half-wave plate 318 may be automatically rotated based on feedback from the one or more sensors 316 until the signal (or contrast) is maximized.

In step 358, an orientation of linearly polarized illumination from the light source is aligned to an orientation of a grating of the one or more DBO metrology targets. For example, the insertable, rotatable half-wave plate 318 may be configured to selectively rotate the rotatable half-wave plate 318 to align an orientation of linearly polarized illumination light from the light source 314 to an orientation of the grating of one or more diagonal DBO metrology targets. In this regard, the insertable, rotatable half-wave plate 318 is configured to align the orientation of the incident linearly polarized illumination from the light source 314 to the orientation of the grating of the one or more diagonal DBO targets to enhance a sensitivity of the one or more sensors 316 to overlay.

In step 360, collected light is transmitted through the half-wave plate and a collection polarizer. In some embodiments, the collection polarizer 332 of the metrology sub-system 302 is maintained at a fixed orientation within the metrology sub-system 302. In this regard, the sample 310 may also be maintained at a fixed orientation within the metrology sub-system 302.

In step 362, light from the collection polarizer is collected with one or more sensors. In one embodiment, the one or more sensors 316 are communicatively coupled with the controller 304 of the system 300. For example, the controller 304 may be configured to receive one or more signals from the one or more sensors 316 indicative of illumination collected from the one or more diagonal DBO metrology targets. In some embodiments, the one or more sensors 316 include one or more array sensors 316 positioned at a pupil plane of the metrology sub-system 302.

In step 364, overlay misregistration is determined between a first layer and a second layer of the one or more diagonal DBO metrology targets based on the collected light. In one embodiment, the controller 304 is configured to determine the overlay misregistration between the first layer and the second layer of the one or more diagonal DBO metrology targets based on one or more signals received from the one or more sensors 316 communicatively coupled to the controller 304.

In some embodiments, the controller 104 is configured to receive one or more signals from the one or more sensors 316 indicative of illumination collected from one or more parallel target elements corresponding with one or more process layers and one or more diagonal elements corresponding with one or more resist layers.

In some embodiments, the controller 304 is configured to determine overlay misregistration between a first resist layer and a second resist layer based on the one or more signals from the one or more diagonal elements.

In some embodiments, the controller 304 is configured to determine overlay misregistration between a first process layer and a second process layer based on the one or more signals from the one or more parallel elements.

FIG. 4A illustrates a simplified schematic view of the metrology system 300 including one or more additional characterization sub-systems 400, in accordance with one or more embodiments of the present disclosure. It is noted that the description of the embodiments of system 300 depicted in FIG. 3A should be extended to the embodiment depicted in FIG. 4A unless otherwise noted herein.

In one embodiment, the metrology system 300 includes one or more additional characterization sub-systems 400. The metrology system 300 may include any characterization sub-system 400 known in the art. For example, the metrology system 300 may include an e-beam metrology tool 400. By way of another example, the metrology system 300 may include an imaging-based metrology tool 400.

In one embodiment, the one or more additional characterization sub-systems 400 are communicatively coupled to the controller 304. For example, the controller 304 may be configured to correct the determined overlay misregistration between a first layer and a second layer of the one or more diagonal DBO metrology targets based on the calibration data from the one or more additional characterization tools. For instance, the controller 304 may be configured to correct the determined overlay misregistration between a resist layer and a process layer of the one or more diagonal DBO metrology targets based on the calibration data from the one or more additional characterization tools. For the purposes of the present disclosure, it is noted herein that the additional character sub-system 400 may be referred to as a characterization tool.

Figure 4B:
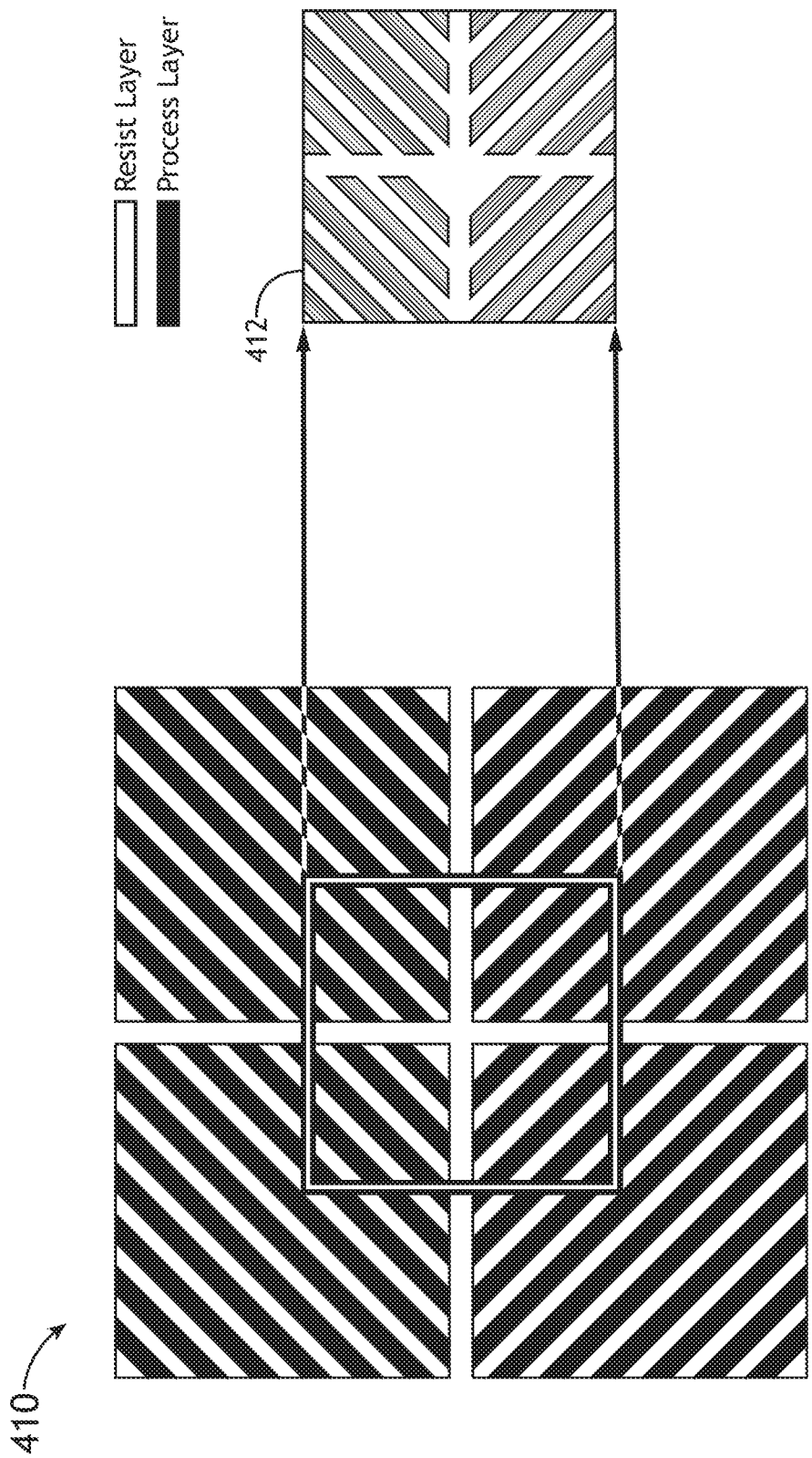
FIG. 4B illustrates a diagonal DOB target, in accordance with one or more embodiments of the present disclosure.

FIG. 4B illustrates one or more diagonal DBO targets 410 including a portion configured to be measured with an additional characterization sub-system 400, in accordance with one or more embodiments of the present disclosure.

In one embodiment, the calibration data from the one or more additional characterization tools is e-beam calibration data. For example, the additional characterization tool may be an e-beam metrology tool, such as but not limited to, an e-beam overlay metrology tool, configured to measure a portion 412 of the DBO target 410. For instance, the e-beam calibration data from the portion 412 of the DBO target 410 may be used as a standard and compared to the DBO metrology targets 410 to calibrate the DBO targets. In this regard, one or more measurements of the DBO target may be adjusted (e.g., the DBO target is calibrated) based on the output of the comparison.

It is noted herein that utilizing e-beam metrology tools (e.g., e-beam overlay metrology tools) to calibrate the DBO targets improves the accuracy and correlation of the metrology system 300. Further, utilizing e-beam metrology tools enables a shrinkage of the On-Product Overlay (OPO) budget.

E-beam metrology tools are generally discussed in International Publication No. WO2011026055, published on Mar. 3, 2011; and U.S. patent application Ser. No. 16/477,552, filed on Jul. 12, 2019, which are both incorporated by reference herein. Targets compatible with e-beam metrology is generally discussed in U.S. patent application Ser. No. 16/477,552, filed on Jul. 12, 2019, which is incorporated by reference herein. Estimating the accuracy of optical and e-beam metrology tools is generally described in U.S. Pat. No. 10,473,460, issued on Nov. 12, 2019; and U.S. Pat. No. 10,533,848, issued on Jan. 14, 2020, which are both incorporated by reference herein.

Figure 4C:
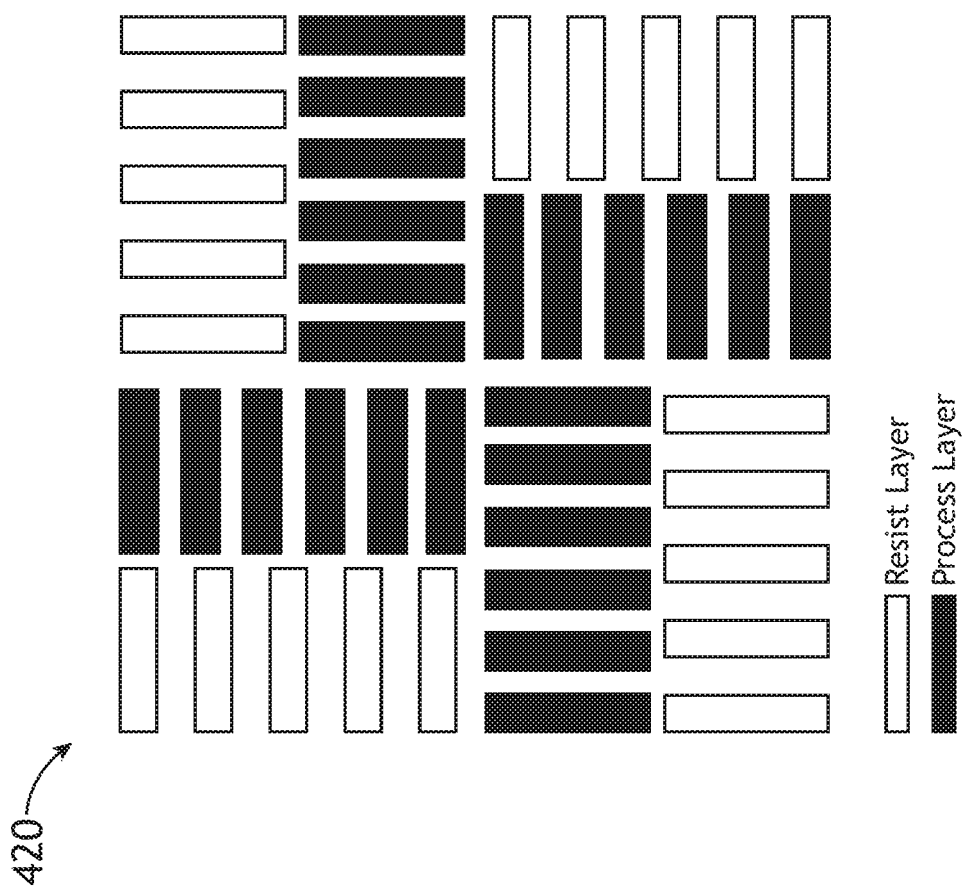
FIG. 4C illustrates an advanced imaging metrology (AIM) target, in accordance with one or more embodiments of the present disclosure.
Figure 4D:
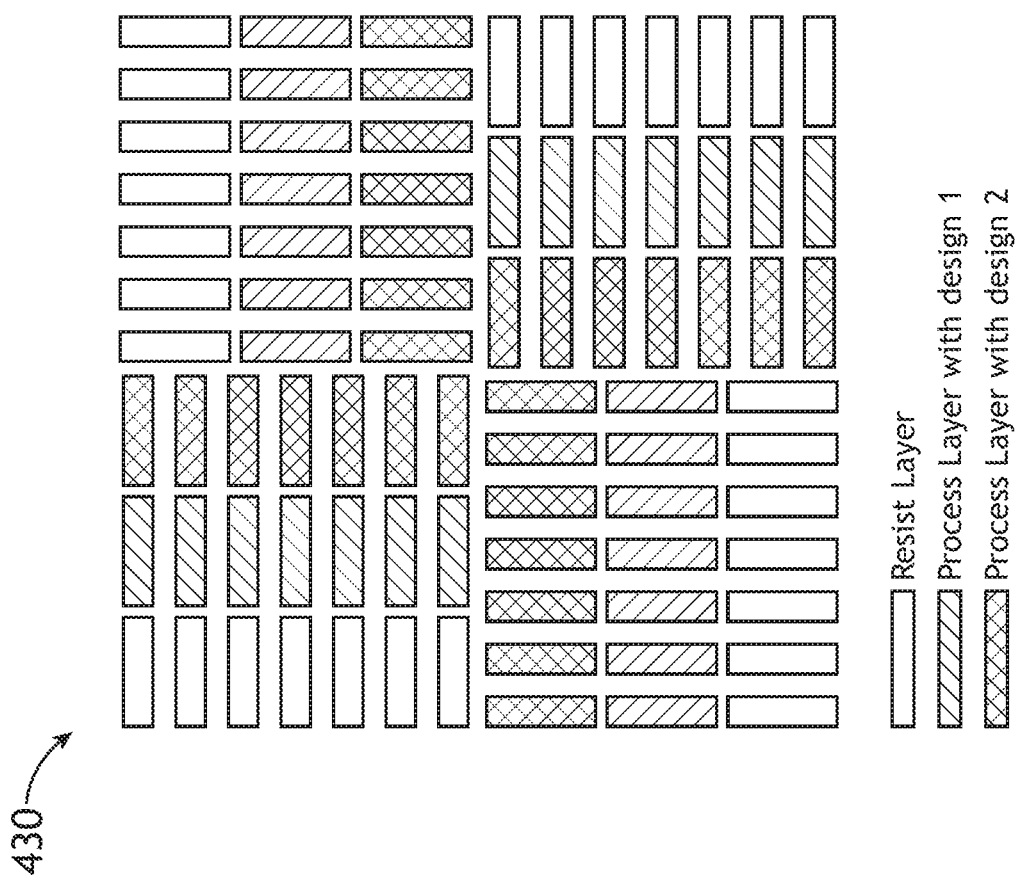
FIG. 4D illustrates a triple AIM target, in accordance with one or more embodiments of the present disclosure.

FIG. 4C illustrates one or more advanced imaging metrology (AIM) targets 420 acquired with an imaging-based characterization sub-system 400, in accordance with one or more embodiments of the present disclosure. FIG. 4D illustrates one or more triple AIM targets 430 acquired with an imaging-based characterization sub-system 400, in accordance with one or more embodiments of the present disclosure.

In one embodiment, the calibration data from the one or more additional characterization tools is imaging-based overlay (IBO) calibration data. For example, the additional characterization tool may be an imaging-based overlay metrology tool configured to measure IBO targets. For instance, the additional characterization tool may be configured to measure AIM targets 420. In another instance, the additional characterization tool may be configured to measure triple AIM targets 430. In this regard, the AIM targets 420 and/or triple AIM targets 430 may be used as a standard target and compared to the DBO metrology targets to calibrate the DBO targets. Further, the one or more measurements of the DBO target may be adjusted (e.g., the DBO target is calibrated) based on the output of the comparison.

In one embodiment, as shown in FIG. 4C, the AIM target 420 may include a resist layer and a process layer. For example, the resist layer and process layer may include similar (or substantial similar) patterns. For instance, the resist layer and the process layer may include straight-line patterns (e.g., x- or y-direction).

In one embodiment, as shown in FIG. 4D, the triple AIM target 430 may include a resist layer and one or more process layers. For example, the AIM target 430 may include a first process layer and at least a second process layer. For instance, the AIM target 430 may include a first process layer with a first design pattern (e.g., Design 1) and at least a second process layer with a second design pattern (e.g., Design 2) that is different from Design 1.

Although FIGS. 4C-4D show a specific design and configuration of resist and process layers, it is noted herein that the AIM targets and triple AIM targets may include any design or configuration known in the art suitable for calibrating the DBO targets. Further, it is noted herein that the use of AIM targets and/or triple AIM targets not in conjunction with DBO targets (e.g., use of only AIM targets and/or triple AIM targets) is much slower than using AIM targets and/or triple AIM targets in conjunction with DBO targets.

It is further noted herein that IBO metrology tools are generally more robust to process variations of the AIM targets and triple AIM targets such that utilizing IBO targets may improve the correlation of the metrology system 300 and the robustness of the metrology system 300.

Figure 4E:
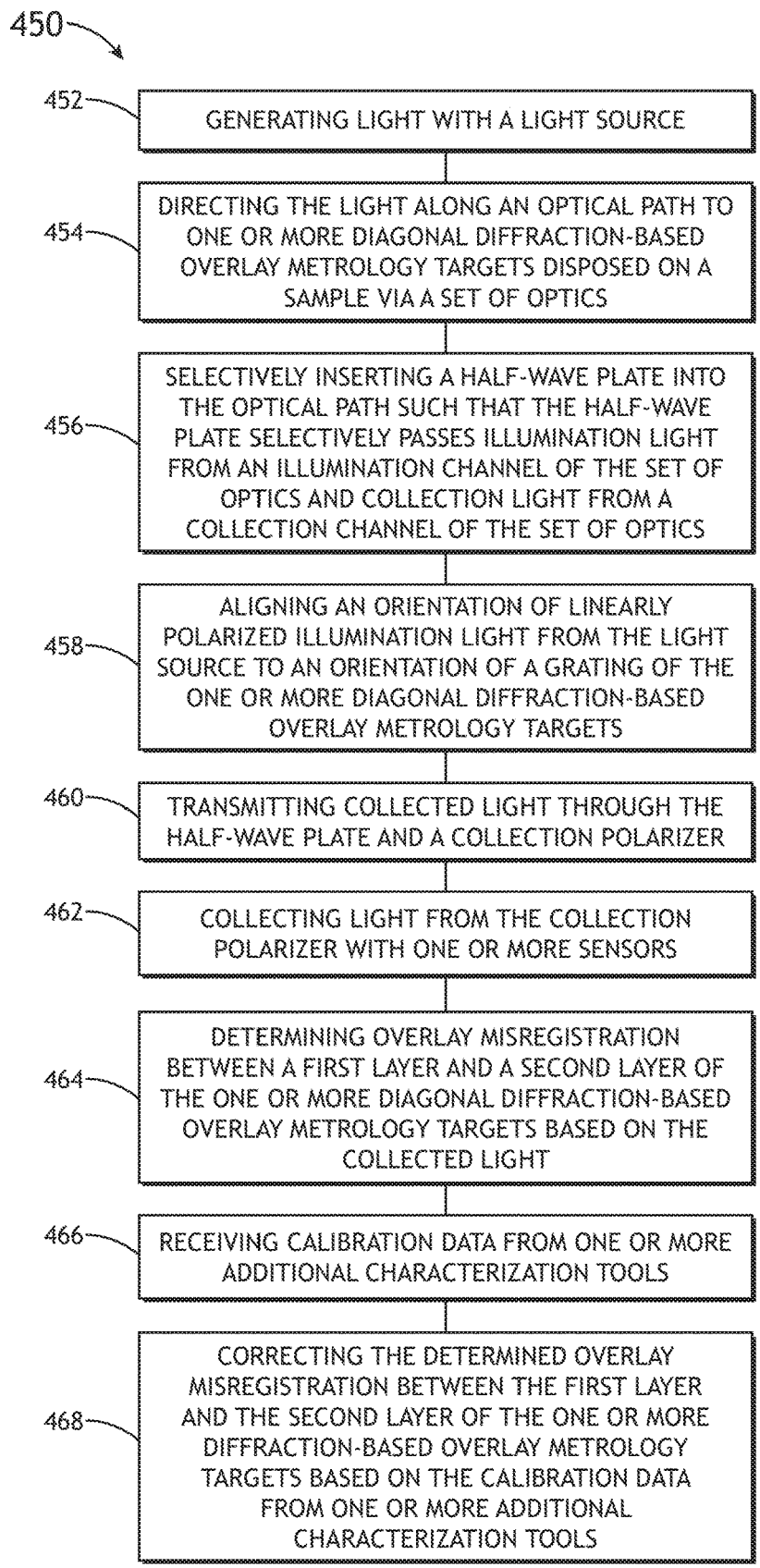
FIG. 4E illustrates a flow diagram of a method for measuring DBO targets, in accordance with one or more embodiments of the present disclosure.

FIG. 4E illustrates a flowchart of a method 450 for measuring diagonal DBO metrology targets, in accordance with one or more embodiments of the present disclosure. It is noted herein that the steps of method 450 may be implemented all or in part by system 300. It is further recognized, however, that the method 450 is not limited to the system 300 in that additional or alternative system-level embodiments may carry out all or part of the steps of method 450.

In step 452, light is generated with a light source. For example, the light source 314 of the metrology sub-system 302 may be configured to generate light. In some embodiments, the light source 314 includes a supercontinuum laser source.

In step 454, the light generated with the light source is directed to one or more DBO metrology targets disposed on a sample via set of optics. In one embodiment, the sample 310 includes one or more DBO metrology targets disposed on the sample 310. For example, the sample 310 may include one or more diagonal DBO metrology targets, such as the diagonal DBO metrology target 200 depicted in FIG. 2. The metrology target may include, but is not limited to, a first layer with a diagonal pattern and a second layer with a straight-line pattern (e.g., x- or y-direction). For instance, the resist layer may have a diagonal pattern and the process layer may have a straight-line pattern, or vice versa. In another instance, the metrology target may include a first layer with a diagonal pattern and a second layer with a diagonal pattern. In this regard, the resist and process layer may both have diagonal patterns.

In step 456, a half-wave plate is selectively inserted in the optical path. For example, the half-wave plate may be selectively inserted such that the half-wave plate selectively passes illumination from an illumination channel of the set of optics and collection light from a collection channel of the set of optics. In one embodiment, the actuation stage 320 of the metrology sub-system 302 is configured to secure the half-wave plate 318 and selectively insert the half-wave plate 318 into the optical path. In this regard, the actuation stage 320 may rotate the half-wave plate 318 once inserted into the optical path.

In one embodiment, the actuation stage 320 may be configured to selectively insert the insertable, rotatable half-wave plate 318 into the optical path and/or rotate the half-wave plate 318 in response to one or more control signals from a controller 304. In another embodiment, the actuation stage 320 may be configured to selectively insert the insertable, rotatable half-wave plate 318 into the optical path in response to one or more control signals from a user-enabled controller. In another embodiment, the actuation stage 320 may be configured to automatically insert the insertable, rotatable half-wave plate 318 into the optical path. For example, the half-wave plate 318 may be automatically inserted into the optical path in response to one or more signals from the one or more sensors 316. In another embodiment, the actuation stage 320 is configured to automatically rotate the insertable, rotatable half-wave plate 318. For example, the half-wave plate 318 may be automatically rotated based on feedback from the one or more sensors 316 until the signal (or contrast) is maximized.

In step 458, an orientation of linearly polarized illumination from the light source is aligned to an orientation of a grating of the one or more DBO metrology targets. For example, the insertable, rotatable half-wave plate 318 may be configured to selectively rotate the rotatable half-wave plate 318 to align an orientation of linearly polarized illumination light from the light source 314 to an orientation of the grating of one or more diagonal DBO metrology targets. In this regard, the insertable, rotatable half-wave plate 318 is configured to align the orientation of the incident linearly polarized illumination from the light source 314 to the orientation of the grating of the one or more diagonal DBO targets to enhance a sensitivity of the one or more sensors 316 to overlay.

In step 460, collected light is transmitted through the half-wave plate and a collection polarizer. In some embodiments, the collection polarizer 332 of the metrology sub-system 302 is maintained at a fixed orientation within the metrology sub-system 302. In this regard, the sample 310 may also be maintained at a fixed orientation within the metrology sub-system 302.

In step 462, light from the collection polarizer is collected with one or more sensors. In one embodiment, the one or more sensors 316 are communicatively coupled with the controller 304 of the system 300. For example, the controller 304 may be configured to receive one or more signals from the one or more sensors 316 indicative of illumination collected from the one or more diagonal DBO metrology targets. In some embodiments, the one or more sensors 316 include one or more array sensors 316 positioned at a pupil plane of the metrology sub-system 302.

In step 464, overlay misregistration is determined between a first layer and a second layer of the one or more diagonal DBO metrology targets based on the collected light. In one embodiment, the controller 304 is configured to determine the overlay misregistration between the first layer and the second layer of the one or more diagonal DBO metrology targets based on one or more signals received from the one or more sensors 316 communicatively coupled to the controller 304.

In step 466, calibration data from one or more additional characterization sub-systems is received. In one embodiment, the one or more additional characterization sub-systems 400 are communicatively coupled to the controller 304. For example, the controller 304 may be configured to correct the determined overlay misregistration between a first layer and a second layer of the one or more diagonal DBO metrology targets based on the calibration data from the one or more additional characterization tools. For instance, the controller 304 may be configured to correct the determined overlay misregistration between a resist layer and a process layer of the one or more diagonal DBO metrology targets based on the calibration data from the one or more additional characterization tools.

In one embodiment, the calibration data from the one or more additional characterization tools is e-beam calibration data. For example, the additional characterization tool may be an e-beam metrology tool, such as but not limited to, an e-beam overlay metrology tool, configured to measure a portion 412 of the DBO target 410. For instance, the e-beam calibration data from the portion 412 of the DBO target 410 may be used as a standard and compared to the DBO metrology targets 410 to calibrate the DBO targets. In this regard, one or more measurements of the DBO target may be adjusted (e.g., the DBO target is calibrated) based on the output of the comparison.

In one embodiment, the calibration data from the one or more additional characterization tools is imaging-based overlay (IBO) calibration data. For example, the additional characterization tool may be an imaging-based overlay metrology tool configured to measure IBO targets. For instance, the additional characterization tool may be configured to measure AIM targets 420. In another instance, the additional characterization tool may be configured to measure triple AIM targets 430. In this regard, the AIM targets 420 and/or triple AIM targets 430 may be used as a standard target and compared to the DBO metrology targets to calibrate the DBO targets. Further, the one or more measurements of the DBO target may be adjusted (e.g., the DBO target is calibrated) based on the output of the comparison.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random-access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
   a stage configured to secure a sample, wherein one or more diffraction-based overlay metrology targets are disposed on the sample;
   a light source;
   one or more sensors; and
   a set of optics configured to direct illumination light from the light source to the one or more diffraction-based overlay metrology targets of the sample,
   wherein the set of optics includes an insertable, rotatable half-wave plate, wherein the insertable, rotatable half-wave plate is selectively insertable into an optical path such that the insertable, rotatable half-wave plate selectively passes both illumination light from an illumination channel of the set of optics and collection light from a collection channel of the set of optics, wherein the insertable, rotatable half-wave plate is configured to selectively align an orientation of linearly polarized illumination light from the light source to an orientation of a grating of the one or more diffraction-based overlay metrology targets.

2. The metrology system of claim 1, wherein the one or more diffraction-based overlay metrology targets include one or more diagonal diffraction-based overlay metrology targets.

3. The metrology system of claim 2, wherein the insertable, rotatable half-wave plate is configured to align the orientation of the incident linearly polarized illumination from the light source to the orientation of the grating of the one or more diagonal diffraction-based overlay metrology targets to enhance a sensitivity of the one or more sensors to overlay.

4. The metrology system of claim 1, further comprising:
an actuation stage, wherein the actuation stage secures the insertable, rotatable half-wave plate and is configured to selectively insert the insertable, rotatable half-wave plate into the optical path and rotate the insertable, rotatable half-wave plate.

5. The metrology system of claim 4, wherein the actuation stage secures the insertable, rotatable half-wave plate is configured to selectively insert the insertable, rotatable half-wave plate into the optical path in response to one or more control signals from a controller.

6. The metrology system of claim 1, wherein a collection polarizer is maintained at a fixed orientation.

7. The metrology system of claim 6, wherein the sample is maintained at a fixed orientation.

8. The metrology system of claim 2, further comprising:
a controller communicatively coupled to the one or more sensors, wherein the controller includes one or more processors configured to:
receive one or more signals from the one or more sensors indicative of illumination collected from the one or more diagonal diffraction-based overlay metrology targets; and
determine overlay misregistration between a first layer and a second layer of the one or more diagonal diffraction-based overlay metrology targets based on the one or more signals received from the one or more sensors.

9. The metrology system of claim 8, wherein the controller is further configured to:
receive one or more signals from the one or more sensors indicative of illumination collected from one or more parallel target elements corresponding with one or more process layers and one or more diagonal elements corresponding with one or more resist layers; and
determine overlay misregistration between a first resist layer and a second resist layer based on the one or more signals from the one or more diagonal elements; and
determine overlay misregistration between a first process layer and a second process layer based on the one or more signals from the one or more parallel elements.

10. The metrology system of claim 8, wherein the controller is further configured to:
receive calibration data from one or more additional characterization tools, wherein the controller corrects the determined overlay misregistration between a resist layer and a process layer of the one or more diagonal diffraction-based overlay metrology targets based on the calibration data from the one or more additional characterization tools.

11. The metrology system of claim 10, wherein the one or more additional characterization tools comprise at least one of an e-beam metrology tool or an imaging-based metrology tool.

12. The metrology system of claim 1, wherein the light source comprises a supercontinuum laser source.

13. The metrology system of claim 1, wherein the illumination from the light source is delivered via a polarized single-mode optical fiber.

14. The metrology system of claim 1, wherein the set of optics includes an apodized illumination pupil, wherein an obliquity of the illumination pupil is adjustable.

15. The metrology system of claim 1, wherein the set of optics includes a spot scanner for providing decoherence to the illumination from the light source.

16. The metrology system of claim 1, wherein the set of optics includes at least one of one or more illumination field stops or one or more collection field stops.

17. The metrology system of claim 1, wherein the one or more sensors comprise: an array sensor positioned at a pupil plane.

18. A method comprising:
generating light with a light source;
directing the light along an optical path to one or more diffraction-based overlay metrology targets disposed on a sample via a set of optics;
selectively inserting a half-wave plate into the optical path such that the half-wave plate selectively passes illumination light from an illumination channel of the set of optics and collection light from a collection channel of the set of optics;
aligning an orientation of linearly polarized illumination light from the light source to an orientation of a grating of the one or more diffraction-based overlay metrology targets;
transmitting collected light through the half-wave plate and a collection polarizer;
collecting light from the collection polarizer with one or more sensors; and
determining overlay misregistration between a first layer and a second layer of the one or more diffraction-based overlay metrology targets based on the collected light.

19. The method of claim 18, wherein the one or more diffraction-based overlay metrology targets include one or more diagonal diffraction-based overlay metrology targets.

20. The method of claim 19, further comprising:
receiving one or more signals from the one or more sensors indicative of illumination collected from one or more parallel target elements corresponding with one or more process layers and one or more diagonal elements corresponding with one or more resist layers; and
determining overlay misregistration between a first resist layer and a second resist layer based on the one or more signals from the one or more diagonal elements; and
determining overlay misregistration between a first process layer and a second process layer based on the one or more signals from the one or more parallel elements.

21. The method of claim 19, further comprising:
receiving calibration data from one or more additional characterization tools; and
correcting the determined overlay misregistration between the first layer and the second layer of the one or more diagonal diffraction-based overlay metrology targets based on the calibration data from the one or more additional characterization tools.

22. A method comprising:
- generating light with a light source;
- directing the light along an optical path to one or more diffraction-based overlay metrology targets disposed on a sample via a set of optics;
- selectively inserting a half-wave plate into the optical path such that the half-wave plate selectively passes illumination light from an illumination channel of the set of optics and collection light from a collection channel of the set of optics;
- aligning an orientation of linearly polarized illumination light from the light source to an orientation of a grating of the one or more diffraction-based overlay metrology targets;
- transmitting collected light through the half-wave plate and a collection polarizer;
- collecting light from the collection polarizer with one or more sensors;
- determining overlay misregistration between a first layer and a second layer of the one or more diffraction-based overlay metrology targets based on the collected light;
- receiving calibration data from one or more additional characterization tools; and
- correcting the determined overlay misregistration between the first layer and the second layer of the one or more diffraction-based overlay metrology targets based on the calibration data from the one or more additional characterization tools.

23. The method of claim 22, wherein the one or more diffraction-based overlay metrology targets include one or more diagonal diffraction-based overlay metrology targets.

* * * * *